United States Patent
Chen et al.

(10) Patent No.: US 10,634,712 B2
(45) Date of Patent: Apr. 28, 2020

(54) CURRENT SENSING CIRCUIT FOR SENSING CURRENT FLOWING THROUGH LOAD SWITCH

(71) Applicant: ANPEC ELECTRONICS CORPORATION, Hsinchu (TW)

(72) Inventors: Chih-Yuan Chen, Hsinchu (TW); Ping-Yu Tsai, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 79 days.

(21) Appl. No.: 16/003,009

(22) Filed: Jun. 7, 2018

(65) Prior Publication Data

US 2019/0271735 A1 Sep. 5, 2019

(30) Foreign Application Priority Data

Mar. 2, 2018 (TW) .............................. 107107093 A

(51) Int. Cl.
*G01R 31/26* (2020.01)
*G01R 19/00* (2006.01)
*G05F 3/26* (2006.01)
*H02M 3/07* (2006.01)

(52) U.S. Cl.
CPC ..... *G01R 31/2621* (2013.01); *G01R 19/0092* (2013.01); *G05F 3/262* (2013.01); *H02M 3/07* (2013.01)

(58) Field of Classification Search
USPC ...................................... 324/76.11, 116–126
See application file for complete search history.

(56) References Cited

U.S. PATENT DOCUMENTS

| | | | | |
|---|---|---|---|---|
| 2007/0296391 A1* | 12/2007 | Bertin | ................ | G01R 19/0092 323/303 |
| 2010/0007328 A1* | 1/2010 | Sander | ............... | G01R 19/0092 324/76.11 |
| 2018/0006643 A1* | 1/2018 | Schulmeyer | ....... | H03K 17/0822 |
| 2018/0123578 A1* | 5/2018 | Chauhan | ............ | G01R 19/0092 |
| 2018/0287602 A1* | 10/2018 | Chauhan | ............ | G01R 19/0092 |

FOREIGN PATENT DOCUMENTS

CN 205280913 U 6/2016

* cited by examiner

*Primary Examiner* — Jay Patidar
(74) *Attorney, Agent, or Firm* — Li & Cai Intellectual Property (USA) Office

(57) ABSTRACT

Disclosed is a current sensing circuit to sense a current flowing through a load switch. The load switch receives a supply voltage to generate an output voltage. The current sensing circuit includes a first circuit and a second circuit. The first circuit is coupled the load switch through a first resistor, and senses the current flowing through the load switch. The second circuit is coupled to the first circuit and the load switch, senses the output voltage, and generates an adjusting current according to the output voltage. The second circuit generates the adjusting current when the output voltage is smaller than a threshold voltage, such that the ratio of the current flowing through the load switch to a current flowing through the first circuit is maintained at certain ratio, but the second circuit is disabled when the output voltage is larger than or equal to the threshold voltage.

9 Claims, 2 Drawing Sheets

CURRENT SENSING CIRCUIT FOR SENSING CURRENT FLOWING THROUGH LOAD SWITCH

BACKGROUND OF THE INVENTION

1. Field of the Invention

The present disclosure relates to a current sensing circuit; in particular, to a current sensing circuit that senses a current flowing through a load switch.

2. Description of Related Art

Generally, when a current sensing circuit is used to sense the current flowing through a load switch, once the load switch is turned on, the voltage at the output end of the load switch begins to increase from zero. At this time, the current flowing through the load switch cannot be precisely obtained by the current sensing circuit, because the voltage at the output end of the load switch is too small. In addition, during the time when the current sensing circuit is sensing the current flowing through a load switch, the voltage at the output end of the load switch may gradually decrease due to a load. In this case, when the voltage at the output end of the load switch is so small that the load switch works in its saturation region, the current flowing through the load switch also cannot be precisely obtained by the current sensing circuit.

For example, if the load switch is a Metal-Oxide-Semiconductor Field-Effect Transistor (MOSFET), when the voltage at the output end of the load switch is not large enough so that the load switch works in its saturation region, the current flowing through the load switch cannot be precisely obtained by the current sensing circuit.

SUMMARY OF THE INVENTION

To overcome the above disadvantages, the present disclosure provides a current sensing circuit to sense a current flowing through a load switch. The load switch receives a supply voltage to generate an output voltage. The current sensing circuit includes a first circuit and a second circuit. The second circuit is coupled to the first circuit and the load switch. The first circuit is coupled to the load switch through a first resistor to sense the current flowing through the load switch. The second circuit is configured to sense the output voltage, and then to generate an adjusting current according to the output voltage.

In the current sensing circuit provided by the present disclosure, when the output voltage is smaller than a threshold voltage, the second circuit generates the adjusting current that maintains the ratio of the current flowing through the load switch to a current flowing through the first circuit at a predetermined ratio. In this manner, the current flowing through the load switch can be calculated according to the predetermined ratio. On the other hand, when the output voltage is larger than or equal to the threshold voltage, the second circuit is disabled.

In the present disclosure, even when the load switch is just turned on so that the voltage of its output end is not large enough or when the voltage of its output end gradually decreases because a load needs power, the current sensing circuit can always precisely sense the current flowing through the load switch according to the predetermined ratio. For example, if the load switch is a MOSFET, the current flowing through the MOSFET can be precisely obtained by the current sensing circuit provided by the present disclosure no matter which operation region the MOSFET is operating in (i.e., the saturation region or the linear region).

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

It will be understood that, although the terms first, second, third, and the like, may be used herein to describe various elements, these elements should not be limited by these terms. These terms are only to distinguish one element from another element, and the first element discussed below could be termed a second element without departing from the teachings of the instant disclosure. As used herein, the term "and/or" includes any and all combinations of one or more of the associated listed items.

Figure 1:
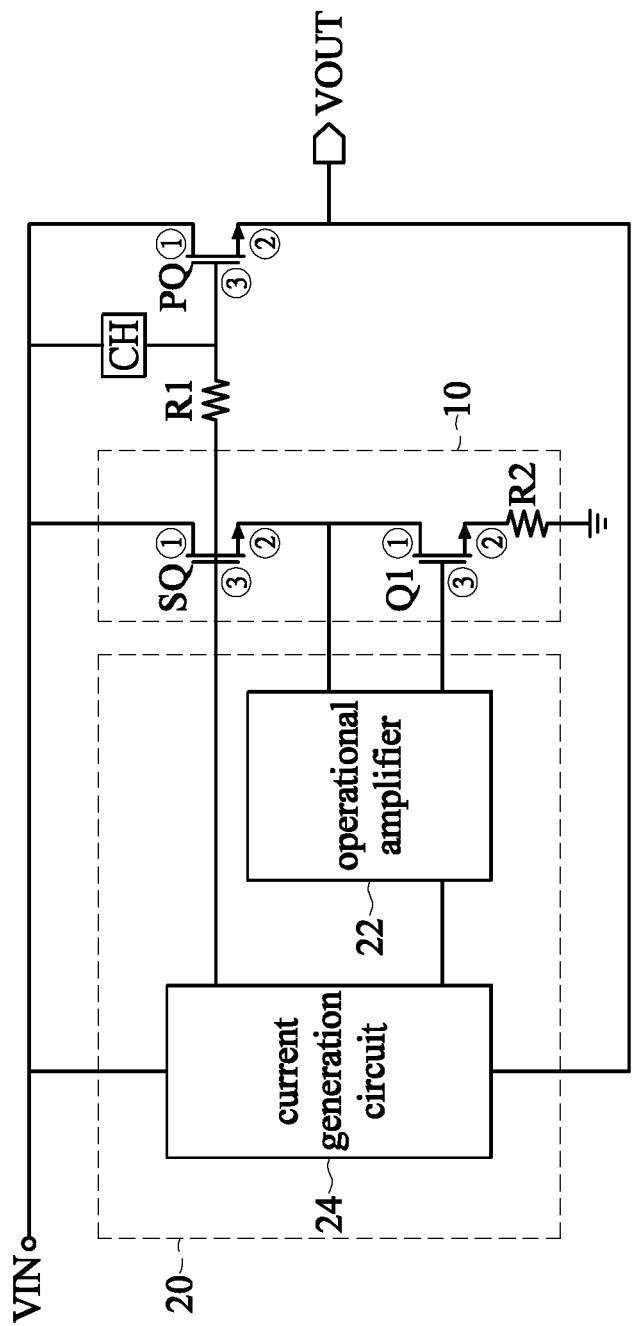
FIG. 1 shows a block diagram of a current sensing circuit according to one embodiment of the present disclosure.

The current sensing circuit provided by the present disclosure is used to sense a current flowing through a load switch. FIG. 1 shows a block diagram of a current sensing circuit according to one embodiment of the present disclosure. As shown in FIG. 1, a load switch PQ (i.e. the load switch to be sensed) receives a supply voltage VIN to generate an output voltage VOUT. The current sensing circuit includes a first circuit 10 and a second circuit 20. The first circuit 10 is coupled to the load switch PQ through a first resistor R1, and the second circuit 20 is coupled to the first circuit 10 and the load switch PQ. The first circuit 10 is configured to sense the current flowing through the load switch PQ, and the second circuit 20 is configured to sense the output voltage VOUT and to accordingly generate an adjusting current IS. The working principle of the current sensing circuit provided by the present disclosure can be briefly described as below. When the output voltage VOUT is smaller than a threshold voltage, it indicates that the output voltage VOUT has not been raised to the supply voltage VIN, or that the output voltage VOUT has dramatically decreased due to a load. In these cases, the second circuit 20 generates the adjusting current IS to maintain the ratio of the current flowing through the load switch to a current flowing through the first circuit 10 at a predetermined ratio. When the ratio of the current flowing through the load switch PQ to the current flowing through the first circuit 10 maintains at the predetermined ratio, the current flowing through the load switch PQ can be calculated according to the current flowing through the first circuit 10 and the predetermined ratio. On the other hand, when the output voltage VOUT is larger than or equal to the threshold voltage, it indicates that the output voltage VOUT has been raised to the supply voltage VIN, or that the output voltage VOUT does not dramatically decrease due to the load. In these cases, the second circuit 20 is disabled, because the ratio of the current flowing through the load switch PQ to the current flowing through the first circuit 10 can be maintained at the predetermined ratio even without the adjusting current IS.

It should be noted that, in this embodiment, the threshold voltage can be freely adjusted by circuit designers, and it is not limited to that disclosed herein.

The circuit configuration of the first circuit 10 and the second circuit 20, and the operational relationship between the first circuit 10 and the second circuit 20, are illustrated in the following descriptions.

According to FIG. 1, the first circuit 10 includes a sensing transistor SQ and a first transistor Q1. The first end of the sensing transistor SQ receives the supply voltage VIN, the second end and the third end of the sensing transistor SQ are coupled to the second circuit 20. The first end of the first transistor Q1 is coupled to the second end of the sensing transistor SQ, the second end of the first transistor Q1 is grounded through a second resistor R2, and the third end of the first transistor Q1 is coupled to the second circuit 20. For ease of illustration, in FIG. 1, the first ends, the second ends and the third ends of the sensing transistor SQ and the first transistor Q1 are symbolized by ①, ② and ③ respectively.

In this embodiment, for example, the load switch PQ can be an NMOS transistor, the sensing transistor SQ can also be an NMOS transistor, and the first transistor Q1 can be a PMOS transistor. If so, the drain of the load switch PQ receives the supply voltage VIN, the output voltage VOUT is outputted from the source of the load switch PQ, and the gate of the load switch PQ is coupled to the first circuit 10 through the first resistor R1. In addition, the first end of the sensing transistor SQ is a drain, the second end of the sensing transistor SQ is a source, and the third end of the sensing transistor SQ is a gate. Moreover, the first end of the first transistor Q1 is a source, the second end of the first transistor Q1 is a drain, and the third end of the first transistor Q1 is a gate. It should be noted that, in this case, since the load switch PQ and the sensing transistor SQ are both NMOS transistors, to ensure that there will be enough voltage to turn on the load switch PQ and the sensing transistor SQ, a charge pump CH is configured to receive the supply voltage VIN and to be coupled to the third end of the load switch PQ as shown in FIG. 1.

The second circuit 20 includes an operational amplifier 22 and a current generation circuit 24. The non-inverting input end of the operational amplifier 22 receives the output voltage VOUT through a third resistor R3, the inverting input end of the operational amplifier 22 is coupled to the second end of the sensing transistor SQ and the first end of the first transistor Q1, and the output end of the operational amplifier 22 is coupled to the third end of the first transistor Q1. The current generation circuit 24 is coupled to the first circuit 10 and the operational amplifier 22 to generate an adjusting current IS. When the output voltage VOUT is smaller than a threshold voltage, the current generation circuit 24 generates the adjusting current IS respectively to the first resistor R1 and the third resistor R3 to maintain the ratio of the current flowing through the load switch PQ to the current flowing through the first circuit 10 at a predetermined ratio.

The circuit configuration and the operation of the current generation circuit 24 are further illustrated in the following descriptions. Specifically speaking, the following descriptions are to describe how the current sensing circuit provided by the present disclosure makes the ratio of the current flowing through the load switch PQ to the current flowing through the first circuit 10 maintain at a predetermined ratio by the adjust current IS generated by the current generation circuit 24.

Figure 2:
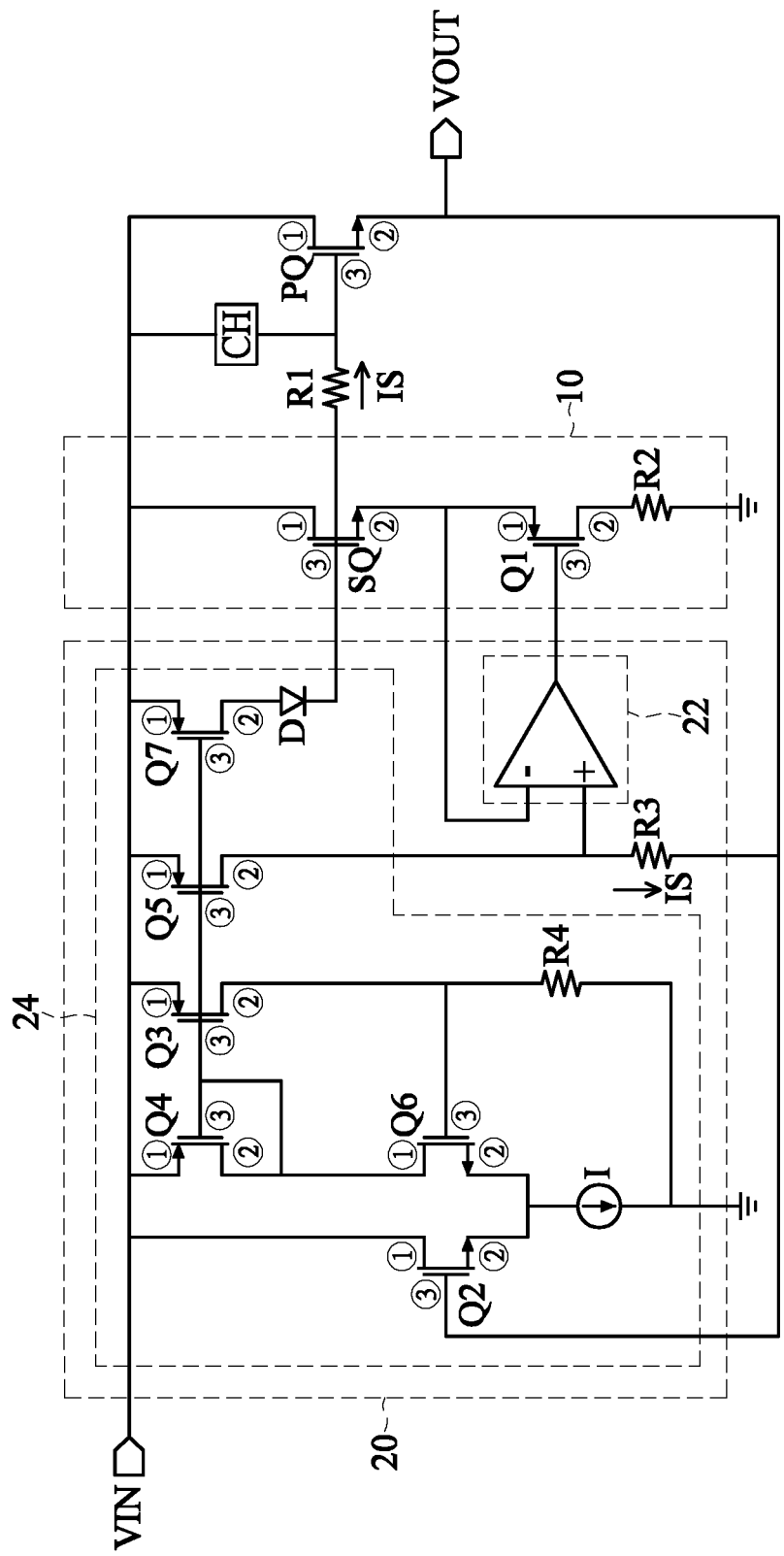
FIG. 2 shows a circuit diagram of a current sensing circuit according to one embodiment of the present disclosure.

FIG. 2 shows a circuit diagram of a current sensing circuit according to one embodiment of the present disclosure.

As shown in FIG. 2, the current generation circuit 24 of the second circuit 20 includes a second transistor Q2, a third transistor Q3 and a current mirror (having no symbol in FIG. 2). The first end of the second transistor Q2 receives the supply voltage VIN, and the third end of the second transistor Q2 receives the output voltage VOUT. The first end of the third transistor Q3 receives the supply voltage VIN, and the second end of the third transistor Q3 is grounded through a fourth resistor R4. The current mirror includes a fourth transistor Q4, a fifth transistor Q5, a sixth transistor Q6, a seventh transistor Q7 and a current source I. The first ends of the fourth transistor Q4, the fifth transistor Q5 and the seventh transistor Q7 receive the supply voltage VIN. The third ends of the third transistor Q3, the fourth transistor Q4, the fifth transistor Q5 and the seventh transistor Q7 are coupled together. The second end of the fifth transistor Q5 is coupled to the non-inverting input end of the operational amplifier 22. The first end of the sixth transistor Q6 is coupled to the second end and the third end of the fourth transistor Q4, and the third end of the sixth transistor Q6 is coupled to the second end of the third transistor Q3. The second end of the seventh transistor Q7 is coupled to the third end of the sensing transistor SQ, and the third end of the seventh transistor Q7 is coupled to the third end of the fourth transistor Q4. One end of the current source I is coupled to the second end of the second transistor Q2 and the second end of the sixth transistor Q6, and the other end of the current source I is grounded.

It should be noted that, to ensure that a current can only flow from the seventh transistor Q7 to the sensing transistor SQ, in this embodiment, a diode D is coupled between the seventh transistor Q7 and the sensing transistor SQ. The anode of the diode D is coupled to the second end of the seventh transistor Q7, and the cathode of the diode D is coupled to the third end of the sensing transistor SQ.

For ease of illustration, in FIG. 2, the first ends, the second ends and the third ends of the sensing transistor SQ, the first transistor Q1 are symbolized by ①, ② and ③ respectively.

In this embodiment, for example, the second transistor Q2 and the sixth transistor Q6 are NMOS transistors, and the third transistor Q3, the fourth transistor Q4, the fifth transistor Q5 and the seventh transistor Q7 are PMOS transistors. The first ends of the second transistor Q2 and the sixth transistor Q6 are drains, the second ends of the second transistor Q2 and the sixth transistor Q6 are sources, and the third ends of the second transistor Q2 and the sixth transistor Q6 are gates. In addition, the first ends of the third transistor Q3, the fourth transistor Q4, the fifth transistor Q5 and the seventh transistor Q7 are sources, the second ends of the third transistor Q3, the fourth transistor Q4, the fifth transistor Q5 and the seventh transistor Q7 are drains, and the third ends of the third transistor Q3, the fourth transistor Q4, the fifth transistor Q5 and the seventh transistor Q7 are gates.

According to FIG. 2, when the output voltage VOUT is smaller than the threshold voltage, the output voltage VOUT is not large enough to turn on the second transistor Q2, and thus the second transistor Q2 is turned off. However, the third transistor Q3 is turned on due to the supply voltage VIN. When the third transistor Q3 is turned on, a current flows through the fourth resistor R4 and thus a voltage at the third end of the sixth transistor Q6 turns on the sixth transistor Q6, such that the adjusting current IS is generated through the current mirror and is provided respectively to the first resistor R1 and the third resistor R3.

The adjusting current IS flows through both of the first resistor R1 and the third resistor R3, so that the voltage at the second end of the sensing transistor SQ is the sum of the output voltage VOUT and the product of the adjusting current IS and the third resistor R3. Additionally, the voltage of the third end of the sensing transistor SQ is the sum of the output voltage VOUT, the drop voltage between the gate and the source of the load switch PQ, and the product of the adjusting current IS and the third transistor R3. In other words, the voltage at the second end of the sensing transistor SQ and the voltage at the third end of the sensing transistor SQ can be represented by Equation 1 and Equation 2 below.

$$SQ_{source} = VOUT + IS*R3 \quad \text{(Equation 1)}$$

In the Equation 1, "$SQ_{source}$" is the voltage at the second end of the sensing transistor SQ, "VOUT" is the output voltage VOUT, and "IS*R3" is the product of the adjusting current IS and the third resistor R3.

$$SQ_{gate} = V_{gs1} + VOUT + IS*R3 \quad \text{(Equation 2)}$$

In the Equation 2, "$SQ_{gate}$" is the voltage of the third end of the sensing transistor SQ, "$V_{gs1}$" is the drop voltage between the gate and the source of the load switch PQ, "VOUT" is the output voltage VOUT, and "IS*R3" is the product of the adjusting current IS and the third resistor R3.

The Equation 1 minus the Equation 2 equals to the Equation 3 as below.

$$SQ_{gate} - SQ_{source} = V_{gs1} \quad \text{(Equation 3)}$$

In the Equation 3, "$SQ_{gate} - SQ_{source}$" is the drop voltage between the gate and the source of the sensing transistor SQ, and "$V_{gs1}$" is the drop voltage between the gate and the source of the load switch PQ.

When the load switch PQ and the sensing transistor SQ are turned on but the output voltage VOUT is smaller than the threshold voltage, the load switch PQ and the sensing transistor SQ are working in the saturation regions. If the predetermined ratio of the current flowing through the load switch PQ to the current flowing through the sensing transistor SQ is 1000:1, the current flowing through the load switch PQ and the current flowing through the sensing transistor SQ can be represented by Equation 4 and Equation 5 below.

$$ID1 = k(V_{gs1} - V_{th})^2 \quad \text{(Equation 4)}$$

$$ID2 = (k/1000)*(V_{gs2} - V_{th})^2 \quad \text{(Equation 5)}$$

In the Equation 4 and the Equation 5, "ID1" is the current flowing through the load switch PQ, "ID2" is the current flowing through the sensing transistor SQ, "$V_{gs1}$" is the drop voltage between the gate and the source of the load switch PQ, "$V_{gs2}$" is the drop voltage between the gate and the source of the sensing transistor SQ, "$V_{th}$" is the turn-on voltages of the load switch PQ and the sensing transistor SQ, and "k" is relevant to the carrier mobility, the gate width and the gate length, and the unit capacitance of the gate oxide of the load switch PQ and the sensing transistor SQ.

Since "$SQ_{gate} - SQ_{source}$" is the drop voltage between the gate and the source of the sensing transistor SQ, according to the Equation 3, the drop voltage between the gate and the source of the sensing transistor SQ is equal to the drop voltage between the gate and the source of the load switch PQ (i.e., in the Equation 4 and the Equation 5, "$V_{gs1}$" is equal to "$V_{gs2}$"). In this manner, the ratio of the current flowing through the load switch PQ to the current flowing through the sensing transistor SQ can be restricted to the predetermined ratio (which is 1000:1 in this case), and the current flowing through the load switch PQ can be calculated according to the predetermined ratio and the current flowing through the sensing transistor SQ.

In other words, when the output voltage VOUT is smaller than the threshold voltage so that the load switch PQ and the sensing transistor SQ are working in their saturation regions, the current generation circuit 24 generates the adjusting current IS. The adjusting current IS are provided respectively to the first resistor R1 and the third resistor R3, such that the drop voltage between the gate and the source of the sensing transistor SQ can be equal to the drop voltage between the gate and the source of the load switch PQ. Thus, the ratio of the current flowing through the load switch PQ to the current flowing through the sensing transistor SQ can be maintained at the predetermined ratio.

To sum up, due to the circuit configuration and the working principle of the current sensing circuit provided by the present disclosure, the ratio of the current flowing through the load switch to the current flowing through the sensing transistor can be always maintained at a predetermined ratio even when the output voltage of the load switch is not large enough. Thus, in the present disclosure, the current flowing through the load switch can be precisely calculated by sensing the current flowing through the sensing transistor.

For example, if the load switch and the sensing transistor are both NMOS transistors, the ratio of the current flowing through the load switch to the current flowing through the sensing transistor can be always maintained at a predetermined ratio no matter which operation region the NMOS transistors are operating in (i.e., the saturation region or the linear region). Therefore, the current flowing through the load switch can be precisely calculated by sensing the current flowing through the sensing transistor.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A current sensing circuit for sensing a current flowing through a load switch, wherein the load switch receives a supply voltage to generate an output voltage, comprising:
a first circuit, coupled the load switch through a first resistor, sensing the current flowing through the load switch; and
a second circuit, coupled to the first circuit and the load switch, sensing the output voltage;
wherein the second circuit generates an adjusting current when the output voltage is smaller than a threshold voltage, the adjusting current flows through the first resistor such that the ratio of the current flowing through the load switch to a current flowing through the first circuit maintains at a predetermined ratio, but the second circuit is disabled when the output voltage is larger than or equal to the threshold voltage; and wherein the first circuit includes:
a sensing transistor, wherein a first end of the sensing transistor receives the supply voltage, and a second end and a third end of the sensing transistor are coupled to the second circuit; and
a first transistor, wherein a first end of the first transistor is coupled to the second end of the sensing transistor, a second end of the first transistor is grounded through a second resistor, and a third end of the first transistor is coupled to the second circuit.

2. The current sensing circuit according to claim 1, further comprising:
a charge pump, coupled to the load switch, receiving the supply voltage;
wherein the load switch is an NMOS transistor, the drain of the NMOS transistor receives the supply voltage, the output voltage is outputted from the source of the NMOS transistor, and the gate of the NMOS transistor is coupled to the first circuit through the first resistor and is also coupled to the charge pump.

3. The current sensing circuit according to claim 2, wherein the sensing transistor is an NMOS transistor, the first end of the sensing transistor is a drain, the second end of the sensing transistor is a source and the third end of the sensing transistor is a gate, and the first transistor is a PMOS transistor, the first end of the first transistor is a source, the second end of the first transistor is a drain and the third end of the first transistor is a gate.

4. The current sensing circuit according to claim 3, wherein the second circuit includes:
an operational amplifier, wherein a non-inverting input end of the operational amplifier receives the output voltage through a third resistor, an inverting input end of the operational amplifier is coupled to the second end of the sensing transistor and the first end of the first transistor, and the output end of the operational amplifier is coupled to the third end of the first transistor; and
a current generation circuit, coupled to the first circuit and the operational amplifier and generating the adjusting current.

5. The current sensing circuit according to claim 4, wherein the current generation circuit provides the adjusting current respectively to the first resistor and the third resistor, such that the voltage at the second end of the sensing transistor is the sum of the output voltage and the product of the adjusting current and the resistance of the third resistor, and the voltage at the third end of the sensing transistor is the sum of the output voltage and the product of the adjusting current and the resistance of the third resistor.

6. The current sensing circuit according to claim 5, wherein the current generation circuit includes:
a second transistor, wherein a first end of the second transistor receives the supply voltage, and a third end of the second transistor receives the output voltage;
a third transistor, wherein a first end of the third transistor receives the supply voltage, and a second end of the third transistor is grounded through a fourth resistor;
a current mirror, including:
a fourth transistor and a fifth transistor, wherein first ends of the fourth transistor and the fifth transistor receive the supply voltage, third ends of the third transistor, the fourth transistor and the fifth transistor are coupled together, and a second end of the fifth transistor is coupled to the non-inverting input end of the operational amplifier; and
a sixth transistor, wherein a first end of the sixth transistor is coupled to a second end and the third end of the fourth transistor, and a third end of the sixth transistor is coupled to the second end of the second end of the third transistor;
a seventh transistor, wherein a first end of the seventh transistor receives the supply voltage, a second end of the seventh transistor is coupled to the third end of the sensing transistor, and a third end of the seventh transistor is coupled to the third end of the fourth transistor; and
a current source, wherein one end of the current source is coupled to a second end of the second transistor and a second end of the sixth transistor, and the other end of the current source is grounded.

7. The current sensing circuit according to claim 6, wherein when the output voltage is smaller than the threshold voltage, the second transistor is turned off but the third transistor is turned on, a current flows through the fourth resistor so that the voltage at the third end of the sixth transistor makes the sixth transistor turn on, such that the current mirror generates the adjusting current.

8. The current sensing circuit according to claim 7, wherein a diode is configured between the sensing transistor and the seventh transistor, the anode of the diode is coupled to the second end of the seventh transistor, and the cathode of the diode is coupled to the third end of the sensing transistor.

9. The current sensing circuit according to claim 7, wherein the second transistor and the sixth transistor are NMOS transistors, the first ends of the second transistor and the sixth transistor are drains, the second ends of the second transistor and the sixth transistor are sources, and the third ends of the second transistor and the sixth transistor are gates;
wherein the third transistor, the fourth transistor, the fifth transistor and the seventh transistor are PMOS transistors, the first ends of the third transistor, the fourth transistor, the fifth transistor and the seventh transistor are sources, the second ends of the third transistor, the fourth transistor, the fifth transistor and the seventh transistor are drains, and the third ends of the third transistor, the fourth transistor, the fifth transistor and the seventh transistor are gates.

* * * * *